United States Patent
Campbell et al.

(10) Patent No.: US 9,357,674 B2
(45) Date of Patent: May 31, 2016

(54) LIQUID-COOLING APPARATUS WITH INTEGRATED COOLANT FILTER

(71) Applicant: INTERNATIONAL BUSINESS MACHINES CORPORATION, Armonk, NY (US)

(72) Inventors: Levi A. Campbell, Poughkeepsie, NY (US); Richard C. Chu, Hopewell Junction, NY (US); Milnes P. David, Fishkill, NY (US); Michael J. Ellsworth, Jr., Poughkeepsie, NY (US); Madhusudan K. Iyengar, Foster City, CA (US); Roger R. Schmidt, Poughkeepsie, NY (US); Robert E. Simons, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 189 days.

(21) Appl. No.: 14/132,230

(22) Filed: Dec. 18, 2013

(65) Prior Publication Data

US 2015/0173251 A1 Jun. 18, 2015

(51) Int. Cl.
*H05K 7/20* (2006.01)

(52) U.S. Cl.
CPC .......... *H05K 7/20218* (2013.01); *H05K 7/2039* (2013.01); *H05K 7/20772* (2013.01); *Y10T 29/4935* (2015.01)

(58) Field of Classification Search
CPC ..... H01M 8/00; H01M 8/04; H01M 8/04044; H01M 8/04783; H05K 7/2039; H05K 7/20827; F28D 15/0266; F28D 15/0275; F24J 3/086
USPC ............... 361/696, 697.47, 697.53, 695, 698, 361/699, 700; 165/45, 185; 29/890.03
See application file for complete search history.

(56) References Cited

U.S. PATENT DOCUMENTS

| | | | | |
|---|---|---|---|---|
| 5,111,280 A | * | 5/1992 | Iversen | H01L 23/427 165/80.4 |
| 6,457,515 B1 | | 10/2002 | Vafai et al. | |

(Continued)

OTHER PUBLICATIONS

Kandlikar et al., "Liquid Cooled Cold Plate for Industrial High-Power Electronic Devices—Thermal Design and Manufacturing Considerations", Heat Transfer Engineering, vol. 30, No. 12, pp. 918-930 (2009).

(Continued)

*Primary Examiner* — Anthony Haughton
*Assistant Examiner* — Matt Dhillon
(74) *Attorney, Agent, or Firm* — Steven Chiu, Esq.; Kevin P. Radigan, Esq.; Heslin Rothenberg Farley & Mesiti P.C.

(57) ABSTRACT

Cooling apparatuses, cooled electronic modules, and methods of fabrication are provided which facilitate heat transfer from an electronic component(s). The cooling apparatus includes a liquid-cooled heat sink with a thermally conductive structure having a coolant-carrying compartment including a region of reduced cross-sectional coolant flow area. The heat sink includes a coolant inlet and outlet in fluid communication with the compartment, and the region of reduced cross-sectional coolant flow area provides an increased effective heat transfer coefficient between a main heat transfer surface of the conductive structure and the coolant. The cooling apparatus further includes a coolant loop coupled to the coolant inlet and outlet to facilitate flow of coolant through the coolant-carrying compartment, and a coolant filter positioned to filter contaminants from the coolant passing through the heat sink. The coolant filter has a larger cross-sectional coolant flow area than the region of reduced cross-sectional coolant flow area.

17 Claims, 10 Drawing Sheets

(56) References Cited

U.S. PATENT DOCUMENTS

| | | | |
|---|---|---|---|
| 6,508,301 | B2 | 1/2003 | Marsala |
| 6,552,901 | B2 | 4/2003 | Hildebrandt |
| 6,675,875 | B1 | 1/2004 | Vafai et al. |
| 6,819,561 | B2 | 11/2004 | Hartzell et al. |
| 7,178,586 | B2 | 2/2007 | Goldman et al. |
| 7,240,722 | B2 | 7/2007 | Lai et al. |
| 7,325,588 | B2 | 2/2008 | Malone et al. |
| 7,400,505 | B2 | 7/2008 | Campbell et al. |
| 7,508,665 | B1 | 3/2009 | Palmer |
| 7,509,995 | B2 | 3/2009 | Bhatti et al. |
| 7,639,499 | B1 | 12/2009 | Campbell et al. |
| 7,916,483 | B2 | 3/2011 | Campbell et al. |
| 8,363,402 | B2* | 1/2013 | Brunschwiler ....... H01L 23/473 165/80.4 |
| 8,729,692 | B2* | 5/2014 | Kim ..................... H01L 23/473 257/690 |
| 2007/0119571 | A1 | 5/2007 | Osawa |
| 2007/0227699 | A1 | 10/2007 | Nishi |
| 2008/0123297 | A1 | 5/2008 | Tilton et al. |
| 2010/0117209 | A1* | 5/2010 | Bezama ................ H01L 23/427 257/686 |
| 2012/0006737 | A1* | 1/2012 | Jiang ...................... B01D 27/06 210/232 |
| 2012/0315563 | A1* | 12/2012 | Na .................... H01M 8/04044 429/450 |
| 2013/0174421 | A1* | 7/2013 | Chainer ............. H05K 7/20781 29/890.03 |
| 2014/0124163 | A1* | 5/2014 | Campbell ........... H05K 7/2039 165/45 |
| 2014/0138075 | A1* | 5/2014 | Yang .................. H01L 23/3735 165/185 |

OTHER PUBLICATIONS

Campbell et al., "Coolant-Cooled Heat Sink Configured for Accelerating Coolant Flow", U.S. Appl. No. 14/058,562, filed Oct. 21, 2013 (40 pages).

* cited by examiner

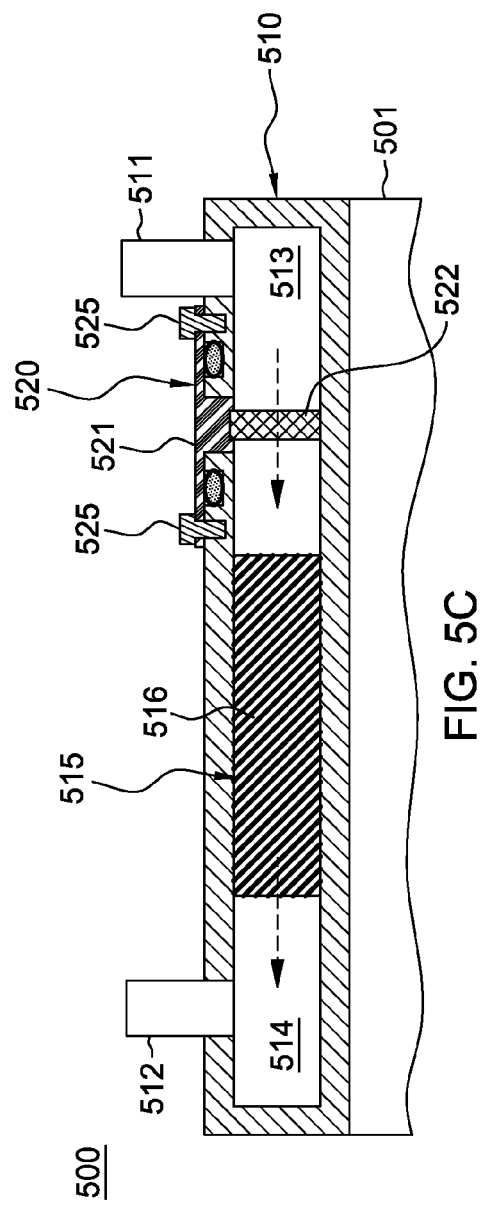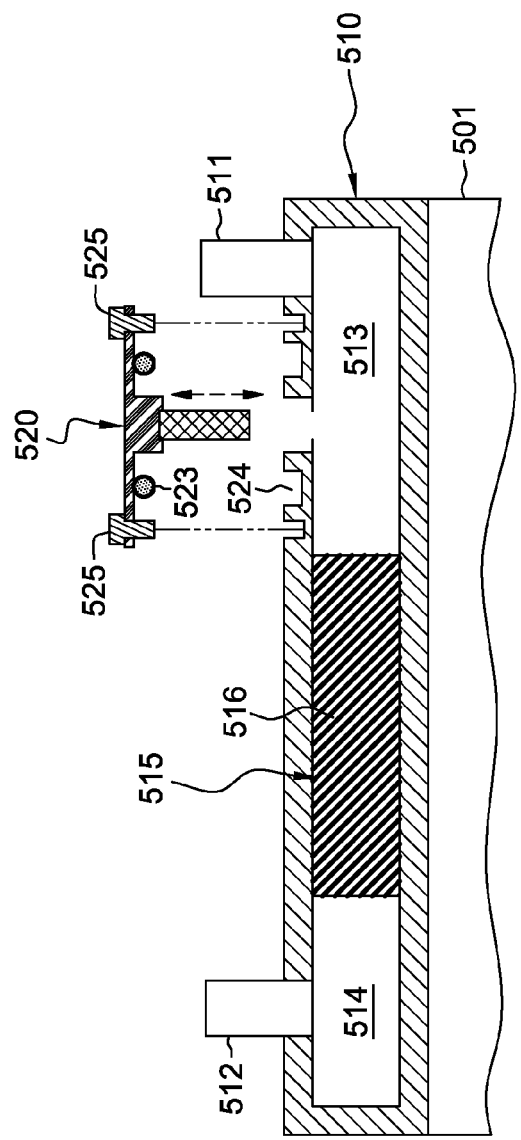

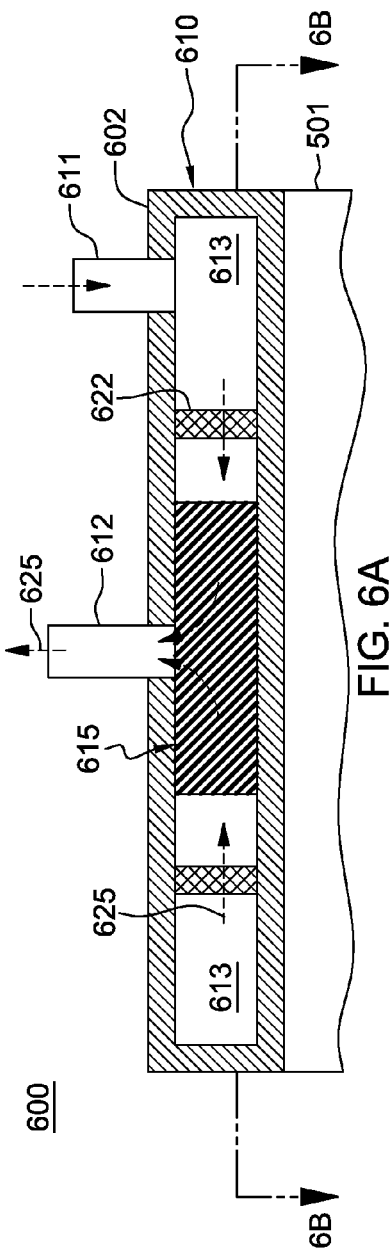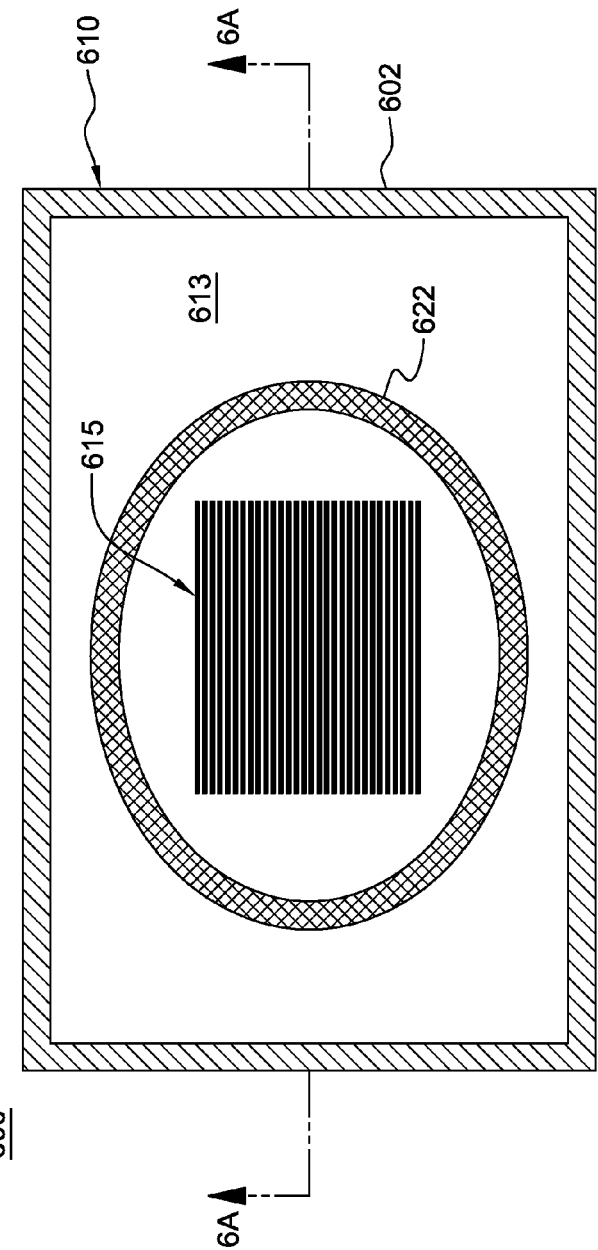

LIQUID-COOLING APPARATUS WITH INTEGRATED COOLANT FILTER

BACKGROUND

As is known, operating electronic components produce heat. This heat should be removed in an effective manner to maintain device junction temperatures within desirable limits, with failure to do so resulting in excessive component temperatures, potentially leading to thermal runaway conditions. Several trends in the electronics industry have combined to increase the importance of thermal management, including heat removal for electronic components, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices or components are packed onto a single chip, heat flux (Watts/cm$^2$) increases, resulting in the need to dissipate more power from a given size chip or module. These trends have combined to create applications where it is no longer desirable to remove heat from modern devices solely by traditional air cooling methods, such as by using air cooled heat sinks with heat pipes or vapor chambers. Such air cooling techniques are inherently limited in their ability to extract heat from an electronic component with high power density.

The need to cool current and future high heat load, high heat flux electronic devices therefore mandates the development of aggressive thermal management techniques using, for instance, liquid cooling.

BRIEF SUMMARY

In one aspect, provided herein is a cooling apparatus, comprising a liquid-cooled heat sink, a coolant loop, and a coolant filter. The liquid-cooled heat sink includes: a thermally conductive structure with a coolant-carrying compartment comprising, at least in part, a region of reduced cross-sectional coolant flow area through which coolant flows; a coolant inlet and a coolant outlet associated with the thermally conductive structure and in fluid communication with the coolant-carrying compartment of the thermally conductive structure to facilitate coolant flow therethrough; and wherein the region of reduced cross-sectional coolant area of the coolant-carrying compartment provides an increased effective heat transfer coefficient between a main heat transfer surface of the thermally conductive structure and the coolant within the coolant-carrying compartment of the liquid-cooled heat sink. The coolant loop is coupled to the coolant inlet and the coolant outlet of the liquid-cooled heat sink to facilitate flow of coolant through the coolant-carrying compartment thereof, and the coolant filter is positioned to filter contaminants from the coolant passing through the liquid-cooled heat sink. The coolant filter has a larger cross-sectional flow area than the region of reduced cross-sectional flow area of the coolant-carrying compartment within the thermally conductive structure of the liquid-cooled heat sink.

In another aspect, a cooled electronic module is provided which includes at least one electronic component, and a cooling apparatus to facilitate cooling the at least one electronic component. The cooling apparatus includes a liquid-cooled heat sink, a coolant loop, and a coolant filter. The liquid-cooled heat sink includes: a thermally conductive structure with a coolant-carrying compartment comprising, at least in part, a region of reduced cross-sectional coolant flow area through which coolant flows; a coolant inlet and a coolant outlet associated with the thermally conductive structure and in fluid communication with the coolant-carrying compartment of the thermally conductive structure to facilitate coolant flow therethrough; and wherein the region of reduced cross-sectional coolant flow area of the coolant-carrying compartment provides an increased effective heat transfer coefficient between a main heat transfer surface of the thermally conductive structure and the coolant within the coolant-carrying compartment of the liquid-cooled heat sink. The coolant loop is coupled to the coolant inlet and the coolant outlet of the liquid-cooled heat sink to facilitate flow of coolant through the coolant-carrying compartment thereof, and the coolant filter is positioned to filter contaminants from the coolant passing through the liquid-cooled heat sink. The coolant filter has a larger cross-sectional flow area than the region of reduced cross-sectional flow area of the coolant-carrying compartment within the thermally conductive structure of the liquid-cooled heat sink.

In a further aspect, a method is provided which includes: providing a liquid-cooled heat sink configured to facilitate cooling at least one electronic component, the liquid-cooled heat sink comprising: a thermally conductive structure with a coolant-carrying compartment comprising, at least in part, a region of reduced cross-sectional coolant flow area through which coolant flows; a coolant inlet and a coolant outlet associated with the thermally conductive structure and in fluid communication with the coolant-carrying compartment of the thermally conductive structure to facilitate coolant flow therethrough; wherein the region of reduced cross-sectional coolant flow area of the coolant-carrying compartment provides an increased effective heat transfer coefficient between a main heat transfer surface of the thermally conductive structure and the coolant within the coolant-carrying compartment; providing a coolant loop coupled to the coolant inlet and the coolant outlet of the liquid-cooled heat sink to facilitate flow of coolant through the coolant-carrying compartment thereof; and providing a coolant filter positioned to filter contaminants from the coolant passing through the liquid-cooled heat sink, the coolant filter having a larger cross-sectional coolant flow area than the region of reduced cross-sectional coolant flow area of the coolant-carrying compartment within the thermally conductive structure of the liquid-cooled heat sink.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 5C depicts a cross-sectional elevational view of the liquid-cooled heat sink of FIG. 5B, taken along line 5C-5C thereof, and shown with a replaceable coolant filter subassembly, in accordance with one or more aspects of the present invention;

FIG. 5D depicts the liquid-cooled heat sink of FIG. 5C, with the replaceable coolant filter subassembly removed from the liquid-cooled heat sink, in accordance with one or more aspects of the present invention;

FIG. 6A is a cross-sectional elevational view of an alternate embodiment of a liquid-cooled heat sink, in accordance with one or more aspects of the present invention;

FIG. 6B is a cross-sectional plan view of the liquid-cooled heat sink of FIG. 6A, taken along line 6B-6B thereof, in accordance with one or more aspects of the present invention;

DETAILED DESCRIPTION

Figure 1:
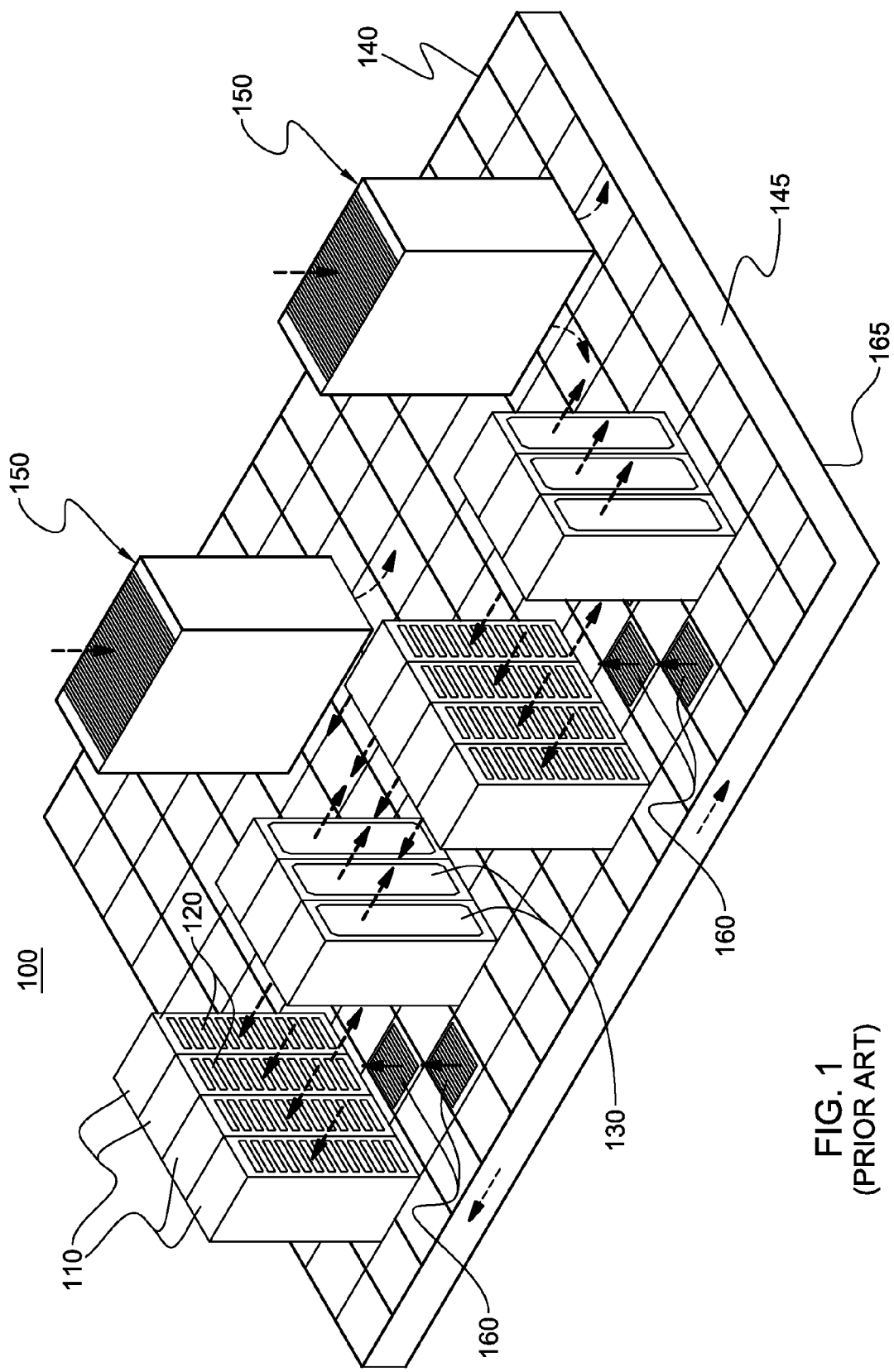
FIG. 1. depicts one embodiment of a conventional raised floor layout of an air-cooled data center.

As used herein, the terms "electronics rack" and "rack unit" are used interchangeably, and unless otherwise specified include any housing, frame, rack, compartment, blade server system, etc., having one or more heat-generating components of a computer system, electronic system, or information technology equipment, and may be, for example, a stand-alone computer processor having high, mid or low end processing capability. In one embodiment, an electronics rack may comprise a portion of an electronic system, a single electronic system, or multiple electronic systems, for example, in one or more sub-housings, blades, books, drawers, nodes, compartments, etc., having one or more heat-generating electronic components disposed therein. An electronic system within an electronics rack may be movable or fixed relative to the electronics rack, with the rack-mounted electronic drawers and blades of a blade center system being two examples of systems of an electronics rack to be cooled.

"Electronic component" refers to any heat-generating electronic component of, for example, a computer system or other electronics unit requiring cooling. By way of example, an electronic component may comprise one or more integrated circuit die (or chips) and/or other electronic devices to be cooled, including one or more processor chips, memory chips and/or memory support chips. Further, the terms "heat sink" or "cold plate" refer to any thermally conductive structure having one or more compartments, channels, passageways, etc., formed therein for the flowing of coolant therethrough. In addition, "metallurgically bonded" refers generally herein to two components being welded, brazed or soldered together by any means.

As used herein, a "liquid-to-liquid heat exchanger" may comprise, for example, two or more coolant flow paths, formed of thermally conductive tubing (such as copper or other tubing) in thermal or mechanical contact with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of the coolants discussed herein, such as the facility coolant or system coolant, is water. However, the cooling concepts disclosed herein are readily adapted to use with other types of coolant on the facility side and/or on the system side. For example, one or more of the coolants may comprise a brine, a fluorocarbon liquid, a hydrofluoroether liquid, a liquid metal, or other similar coolant, or refrigerant, while still maintaining the advantages and unique features of the present invention.

Reference is made below to the drawings, which are not drawn to scale to facilitate an understanding thereof, wherein the same reference numbers used throughout different figures designate the same or similar components.

FIG. 1 depicts one embodiment of a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic devices within the system(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within the data center 100. Room air is taken into each air conditioning unit 150 near an upper portion thereof. This room air may comprise in part exhausted air from the "hot" aisles of the computer installation defined, for example, by opposing air outlet sides 130 of the electronics racks 110.

Figure 2:
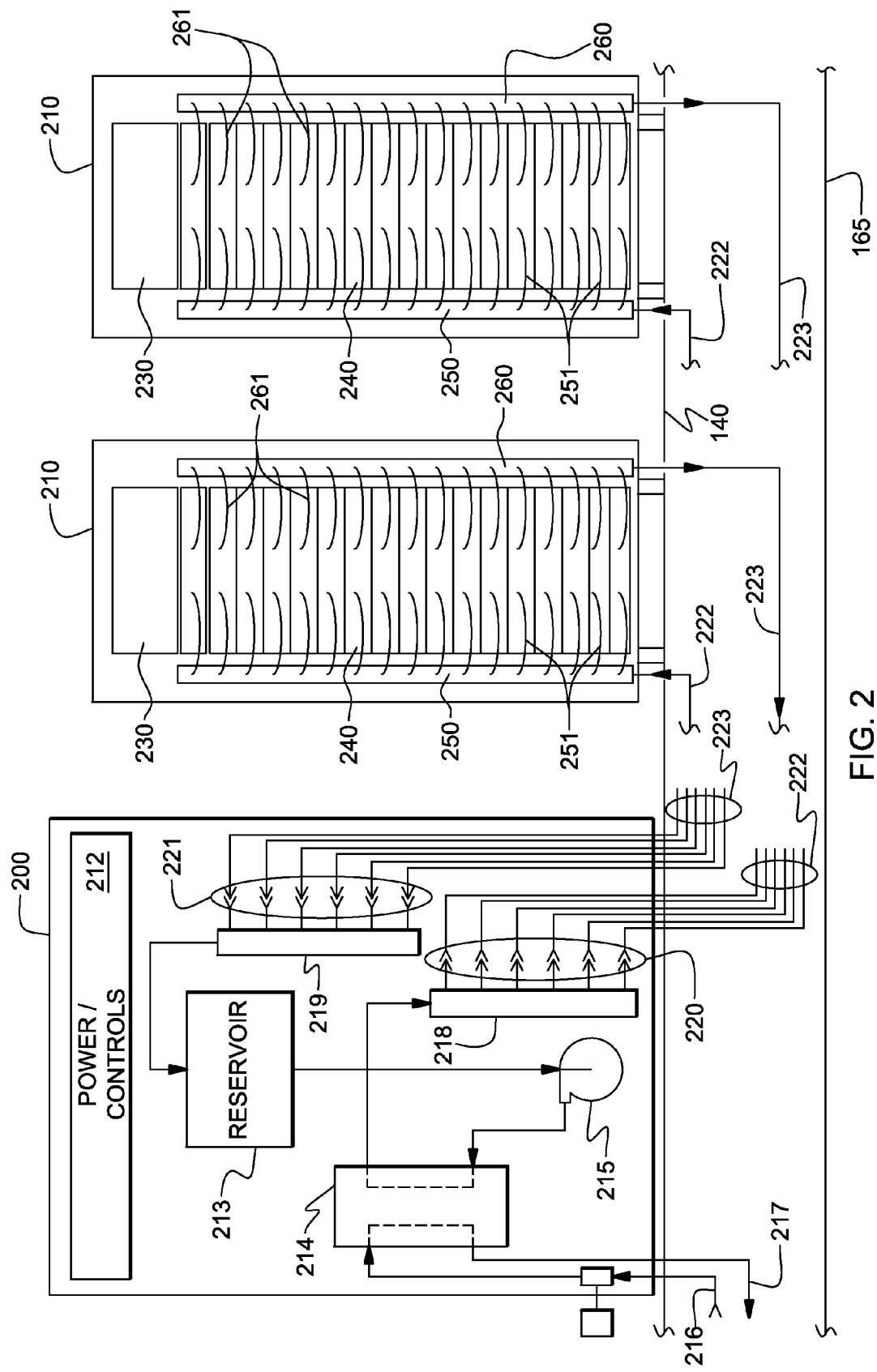
FIG. 2 depicts one embodiment of a coolant distribution unit facilitating liquid-cooling of electronics racks of a data center, in accordance with one or more aspects of the present invention.
Figure 3:
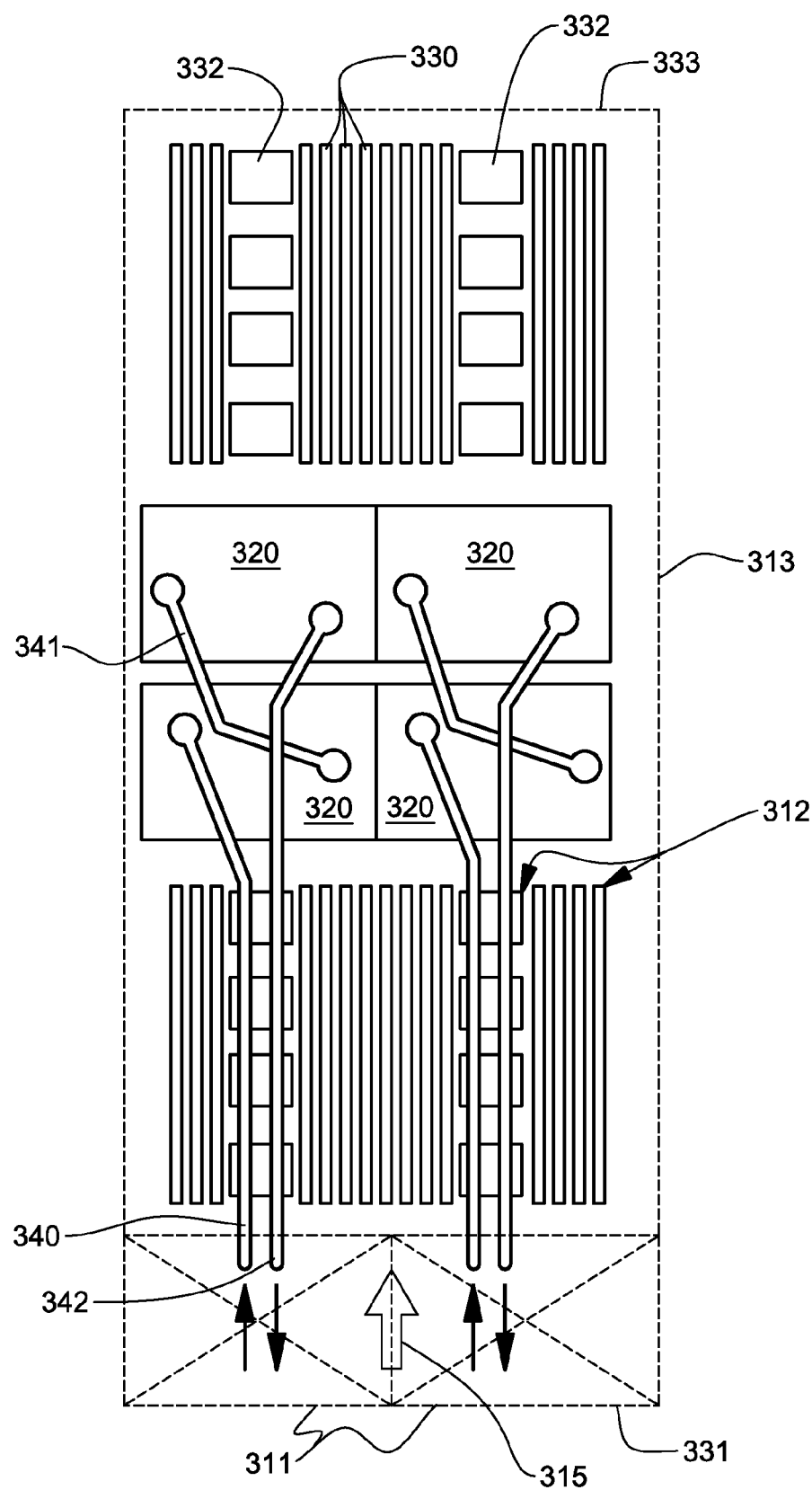
FIG. 3 is a plan view of one embodiment of an electronic system (or node) layout illustrating an air and liquid cooling apparatus for cooling components of the electronic system, in accordance with one or more aspects of the present invention.
Figure 4:
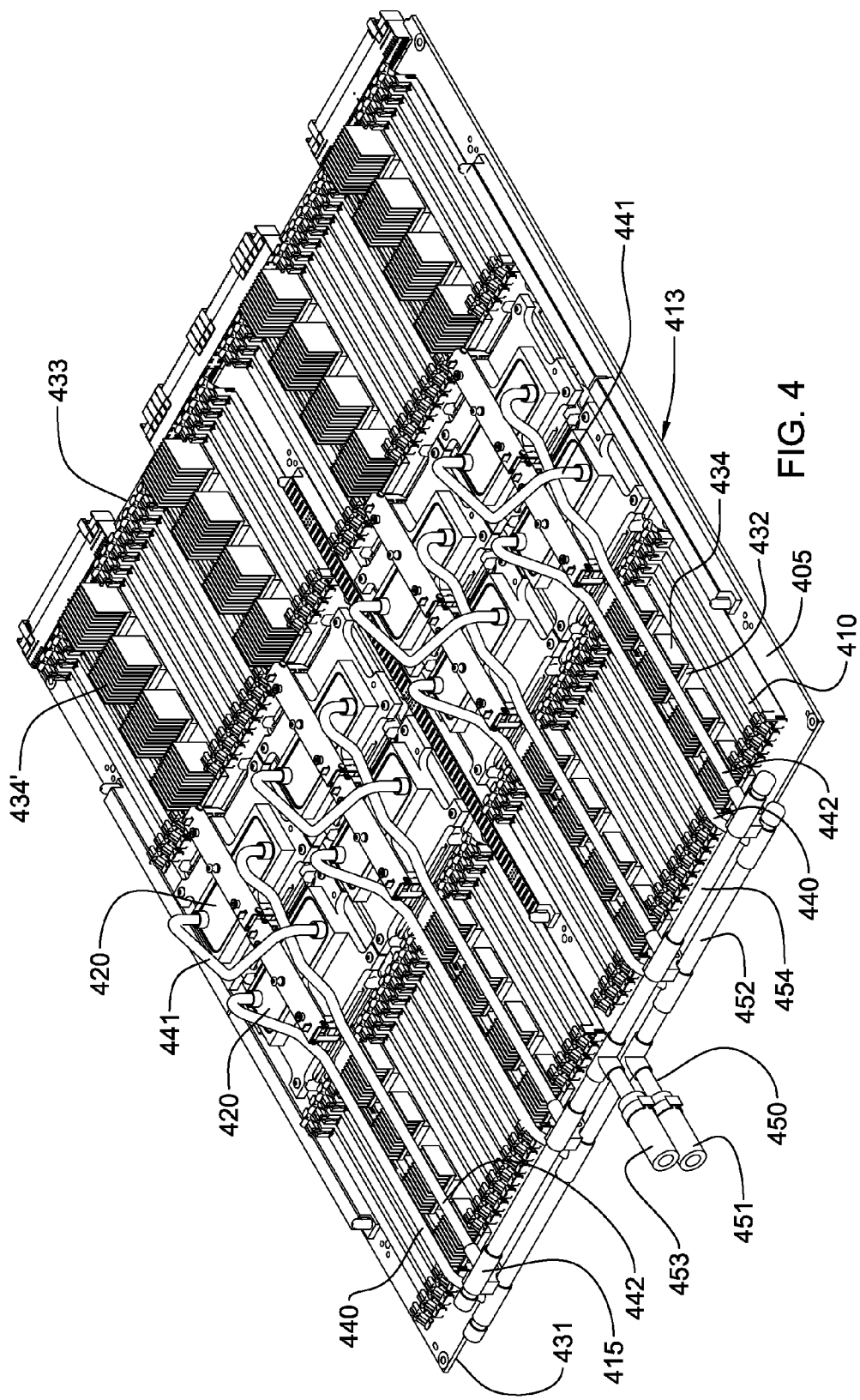
FIG. 4 depicts one detailed embodiment of a partially assembled electronic system layout, wherein the electronic system includes eight heat-generating electronic components to be liquid-cooled, each having, in one embodiment, a respective cooling apparatus associated therewith, in accordance with one or more aspects of the present invention.

Due to the ever-increasing airflow requirements through electronics racks, and the limits of air distribution within the typical data center installation, liquid-based cooling may, for instance, be combined with the above-described conventional air-cooling. FIGS. 2-4 illustrate one embodiment of a data center implementation employing a liquid-based cooling system with one or more cold plates coupled to high heat-generating electronic components disposed within an electronics rack.

In particular, FIG. 2 depicts one embodiment of a coolant distribution unit 200 for a data center. The coolant distribution unit is conventionally a relatively large unit which occupies what would be considered a full electronics frame. Within coolant distribution unit 200 is a power/control element 212, a reservoir/expansion tank 213, a heat exchanger 214, a pump 215 (often accompanied by a redundant second pump), facility water inlet 216 and outlet 217 supply pipes, a supply manifold 218 supplying water or system coolant to the electronics racks 210 via couplings 220 and lines 222, and a return manifold 219 receiving water from the electronics racks 210, via lines 223 and couplings 221. Each electronics rack includes (in one example) a power/control unit 230 for the electronics rack, multiple electronic systems 240, a system coolant supply manifold 250, and a system coolant return manifold 260. As shown, each electronics rack 210 is disposed on raised floor 140 of the data center with lines 222 providing system coolant to system coolant supply manifolds 250 and lines 223 facilitating return of system coolant from system coolant return manifolds 260 being disposed in the supply air plenum beneath the raised floor.

In the embodiment illustrated, the system coolant supply manifold 250 provides system coolant to the cooling systems of the electronic systems (more particularly, to liquid-cooled cold plates thereof) via flexible hose connections 251, which are disposed between the supply manifold and the respective electronic systems within the rack. Similarly, system coolant return manifold 260 is coupled to the electronic systems via flexible hose connections 261. Quick connect couplings may be employed at the interface between flexible hoses 251, 261 and the individual electronic systems. By way of example, these quick connect couplings may comprise various types of commercially available couplings, such as those available from Colder Products Company, of St. Paul, Minn., USA, or Parker Hannifin, of Cleveland, Ohio, USA.

Although not shown, electronics rack 210 may also include an air-to-liquid heat exchanger disposed at an air outlet side thereof, which also receives system coolant from the system coolant supply manifold 250 and returns system coolant to the system coolant return manifold 260.

FIG. 3 depicts one embodiment of an electronic system 313 component layout wherein one or more air moving devices 311 provide forced air flow 315 to cool multiple components 312 within electronic system 313. Cool air is taken in through a front 331 and exhausted out a back 333 of the system. The multiple components to be cooled include multiple processor modules to which liquid-cooled cold plates 320 (of a liquid-based cooling system) are coupled, as well as multiple arrays of memory modules 330 (e.g., dual in-line memory modules (DIMMs)) and multiple rows of memory support modules 332 (e.g., DIMM control modules) to which air-cooled heat sinks are coupled. In the embodiment illustrated, memory modules 330 and the memory support modules 332 are partially arrayed near front 331 of electronic system 313, and partially arrayed near back 333 of electronic system 313. Also, in the embodiment of FIG. 3, memory modules 330 and the memory support modules 332 are cooled by air flow 315 across the electronic system.

The illustrated liquid-based cooling system further includes multiple coolant-carrying tubes connected to and in fluid communication with liquid-cooled cold plates 320. The coolant-carrying tubes comprise sets of coolant-carrying tubes, with each set including (for example) a coolant supply tube 340, a bridge tube 341 and a coolant return tube 342. In this example, each set of tubes provides liquid coolant to a series-connected pair of cold plates 320 (coupled to a pair of processor modules). Coolant flows into a first cold plate of each pair via the coolant supply tube 340 and from the first cold plate to a second cold plate of the pair via bridge tube or line 341, which may or may not be thermally conductive. From the second cold plate of the pair, coolant is returned through the respective coolant return tube 342. Note that in an alternate implementation, each liquid-cooled cold plate 320 could be coupled directly to a respective coolant supply tube 340 and coolant return tube 342, that is, without series connecting two or more of the liquid-cooled cold plates.

FIG. 4 depicts in greater detail an alternate electronic system layout comprising eight processor modules, each having a respective liquid-cooled cold plate of a liquid-based cooling system coupled thereto. The liquid-based cooling system is shown to further include associated coolant-carrying tubes for facilitating passage of liquid coolant through the liquid-cooled cold plates and a header subassembly to facilitate distribution of liquid coolant to and return of liquid coolant from the liquid-cooled cold plates. By way of specific example, the liquid coolant passing through the liquid-based cooling subsystem is cooled and conditioned (e.g., filtered) water.

FIG. 4 is an isometric view of one embodiment of an electronic system or drawer, and monolithic cooling system. The depicted planar server assembly includes a multi-layer printed circuit board to which memory DIMM sockets and various electronic components to be cooled are attached both physically and electrically. In the cooling system depicted, a supply header is provided to distribute liquid coolant from a single inlet to multiple parallel coolant flow paths and a return header collects exhausted coolant from the multiple parallel coolant flow paths into a single outlet. Each parallel coolant flow path includes one or more cold plates in series flow arrangement to facilitate cooling one or more electronic components to which the cold plates are mechanically and thermally coupled. The number of parallel paths and the number of series-connected liquid-cooled cold plates depends, for example, on the desired component temperature, available coolant temperature and coolant flow rate, and the total heat load being dissipated from each electronic component.

More particularly, FIG. 4 depicts a partially assembled electronic system 413 and an assembled liquid-based cooling system 415 coupled to primary heat-generating components (e.g., including processor die) to be cooled. In this embodiment, the electronic system is configured for (or as) a node of an electronics rack, and includes, by way of example, a support substrate or planar board 405, a plurality of memory module sockets 410 (with the memory modules (e.g., dual in-line memory modules) not shown), multiple rows of memory support modules 432 (each having coupled thereto an air-cooled heat sink 434), and multiple processor modules (not shown) disposed below the liquid-cooled cold plates 420 of the liquid-based cooling system 415.

In addition to liquid-cooled cold plates 420, liquid-based cooling system 415 includes multiple coolant-carrying tubes, including coolant supply tubes 440 and coolant return tubes 442 in fluid communication with respective liquid-cooled cold plates 420. The coolant-carrying tubes 440, 442 are also connected to a header (or manifold) subassembly 450 which facilitates distribution of liquid coolant to the coolant supply tubes and return of liquid coolant from the coolant return tubes 442. In this embodiment, the air-cooled heat sinks 434 coupled to memory support modules 432 closer to front 431 of electronic system 413 are shorter in height than the air-cooled heat sinks 434' coupled to memory support modules 432 near back 433 of electronic system 413. This size difference is to accommodate the coolant-carrying tubes 440, 442 since, in this embodiment, the header subassembly 450 is at the front 431 of the electronics drawer and the multiple liquid-cooled cold plates 420 are in the middle of the drawer.

By way of example, liquid-based cooling system 415 comprises (in one embodiment) a pre-configured monolithic structure which includes multiple (pre-assembled) liquid-cooled cold plates 420 configured and disposed in spaced relation to engage respective heat-generating electronic components. Each liquid-cooled cold plate 420 includes, in this embodiment, a liquid coolant inlet and a liquid coolant outlet, as well as an attachment subassembly (i.e., a cold plate/load arm assembly). Each attachment subassembly is employed to couple its respective liquid-cooled cold plate 420 to the associated electronic component to form the cold plate and electronic component (or device) assemblies. Alignment openings (i.e., thru-holes) are provided on the sides of the cold plate to receive alignment pins or positioning dowels during the assembly process. Additionally, connectors (or guide pins) are included within attachment subassembly, which facilitate use of the attachment assembly.

As shown in FIG. 4, header subassembly 450 includes two liquid manifolds, i.e., a coolant supply header 452 and a coolant return header 454, which in one embodiment, are coupled together via supporting brackets. In the monolithic cooling structure of FIG. 4, the coolant supply header 452 is metallurgically bonded in fluid communication to each coolant supply tube 440, while the coolant return header 454 is metallurgically bonded in fluid communication to each coolant return tube 452. A single coolant inlet 451 and a single coolant outlet 453 extend from the header subassembly for coupling to the electronics rack's coolant supply and return manifolds (not shown).

FIG. 4 also depicts one embodiment of the pre-configured, coolant-carrying tubes. In addition to coolant supply tubes 440 and coolant return tubes 442, bridge tubes or lines 441 are provided for coupling, for example, a liquid coolant outlet of one liquid-cooled cold plate to the liquid coolant inlet of another liquid-cooled cold plate to connect in series fluid flow the cold plates, with the pair of cold plates receiving and returning liquid coolant via a respective set of coolant supply and return tubes. In one embodiment, the coolant supply tubes 440, bridge tubes 441 and coolant return tubes 442 are each pre-configured, semi-rigid tubes formed of a thermally conductive material, such as copper or aluminum, and the tubes are respectively brazed, soldered or welded in a fluid-tight manner to the header subassembly and/or the liquid-cooled cold plates. The tubes are pre-configured for a particular electronics system to facilitate installation of the monolithic structure in engaging relation with the electronic system.

As noted, the need to cool current and future high-heat load and high-heat flux electronic components requires the development of extremely aggressive thermal management techniques, such as liquid-cooling using jet impingement techniques and/or fin-based or pin-based cold plate devices. Possible issues with liquid cooling include, for instance, sealing, clogging due to particle contamination, thermal conductivity of the cold plate material, effectiveness of the thermal interface to the electronics, thermal expansion mismatch between the cold plate and the electronic components to be cooled, and manufacturability.

Often, the liquid-cooled heat sink or cold plate can operate in the fully-developed laminar regime, in which the Nusselt number is substantially constant with respect to fluid velocity in the fully developed region through the fin gaps. Under such conditions, in order to improve the thermal performance of the heat sink, there is a desire to use a finned or pinned array structure that has very small hydraulic cross-sectional flow areas, so as to increase the heat transfer coefficient (that is, at a constant Nusselt number). To date, liquid-cooled cold plates with fin channel gaps, for instance, 1.5 mm or greater have been used. However, there is interest in further reducing the channel spacing, that is, the hydraulic cross-sectional flow area to, for instance, 0.3 mm or below, which will introduce greater risk of channel clogging due to particulate contamination, with the related issues of lower thermal performance due to ineffective channels, and a lower liquid flow rate due to a higher cold plate pressure drop.

In view of this, disclosed herein are various cooling apparatuses comprising various liquid-cooled heat sinks or cold plates, which have integral coolant filters or integral coolant filter subassemblies associated with the liquid-cooled heat sink, or a coolant loop which feeds coolant through the liquid-cooled heat sink.

In one aspect, disclosed below is a cooling apparatus which includes a liquid-cooled heat sink having a thermally conductive structure with a coolant-carrying compartment comprising, at least in part, a region of reduced cross-sectional coolant flow area through which coolant flows. For instance, the coolant-carrying compartment may have one or more regions with coolant flow openings or channels less than 0.5 mm in critical dimension. In certain embodiments, the coolant flows in a direction, at least partially, substantially parallel to a main heat transfer surface of the thermally conductive structure, for example, parallel to a main heat transfer surface to which one or more electronic components to be cooled are coupled, and across which heat is transferred from the electronic component(s) to the heat sink. The liquid-cooled heat sink further includes a coolant inlet and a coolant outlet associated with the thermally conductive structure and in fluid communication with the coolant-carrying compartment of the thermally conductive structure to facilitate coolant flow therethrough. The region of reduced cross-sectional coolant flow area of the coolant-carrying compartment is configured to provide an increased effective heat transfer coefficient between a main heat transfer surface of the thermally conductive structure and the coolant within the coolant-carrying compartment. The cooling apparatus further includes a coolant loop coupled to the coolant inlet and the coolant outlet of the liquid-cooled heat sink to facilitate flow of coolant through the coolant-carrying compartment, and a coolant filter positioned to filter contaminants from the coolant passing through the liquid-cooled heat sink, the coolant filter having a larger cross-sectional coolant flow area than a coolant flow area of the region of reduced cross-sectional coolant flow area of the coolant-carrying compartment within the thermally conductive structure of the liquid-cooled heat sink.

For example, in one embodiment, the thermally conductive structure may be configured with an increasing wetted surface area within the coolant-carrying compartment in the direction of coolant flow; that is, may be configured with an increasing surface area exposed to the coolant flow on which the increasing effective heat transfer coefficient may act. In another embodiment, the thermally conductive structure may include multiple coolant flow regions serially coupled in fluid communication within the coolant flow compartment, wherein the cross-sectional coolant flow area may vary between coolant flow regions of the multiple coolant flow regions of the coolant-carrying compartment of the thermally conductive structure. By way of example, the multiple coolant flow regions may include multiple thermally conductive fin regions, wherein one or more fin region characteristics or attributes may vary between different thermally conductive fin regions of the multiple thermally conductive fin regions. For instance, in one embodiment, a size of thermally conductive fins may increase from one thermally conductive fin region to another thermally conductive fin region of the multiple thermally conductive fin regions, which facilitates providing a reduced cross-sectional coolant flow area in the another thermally conductive fin region compared with the one thermally conductive fin region, wherein the one thermally conductive fin region is upstream of the another thermally conductive fin region in the direction of coolant flow through the coolant-carrying compartment.

In another example, a number of thermally conductive fins may increase from one thermally conductive fin region to another thermally conductive fin region of the multiple thermally conductive fin regions, which facilitates providing a reduced cross-sectional coolant flow area in the another thermally conductive fin region compared to the one thermally conductive fin region, wherein the one thermally conductive fin region is upstream of the another thermally conductive fin region in the direction of coolant flow through the coolant-carrying compartment.

As a specific example, a size of thermally conductive fins may increase from a first thermally conductive fin region to a second thermally conductive fin region of the multiple thermally conductive fin regions, which facilitates reducing the cross-sectional coolant flow area in the second thermally conductive fin region compared with the first thermally conductive fin region, and a number of thermally conductive fin regions may increase from the second thermally conductive fin region to a third thermally conductive fin region of the multiple thermally conductive fin regions, which further reduces the cross-sectional coolant flow area in the third thermally conductive fin region compared with the second thermally conductive fin region. In this example, the first thermally conductive fin region is upstream of the second thermally conductive fin region, and the second thermally conductive fin region is upstream of the third thermally conductive fin region in the direction of coolant flow through the coolant-carrying compartment of the thermally conductive structure.

In one implementation, the coolant-cooled heat sink includes a coolant inlet manifold region and a coolant outlet manifold region within the coolant-carrying compartment, the coolant inlet manifold region receiving coolant from the coolant inlet, and the coolant outlet manifold region exhausting coolant from the coolant outlet, wherein the one or more reduced coolant flow regions are disposed between the coolant inlet manifold region and the coolant outlet manifold region. In another embodiment, the region of reduced coolant flow may comprise multiple thermally conductive pin fin regions, and wherein one thermally conductive pin fin region of the multiple thermally conductive pin fin regions may comprise pin fins of different sizes, with smaller pin fins being interspersed among larger pin fins. Further, in an implementation where the thermally conductive fins comprise pin fins, density of the thermally conductive pin fins may increase from one thermally conductive fin region to another thermally conductive fin region, which facilitates providing a reduced transverse coolant flow area in the another thermally conductive fin region compared to the one thermally conductive fin region, wherein the one thermally conductive fin region is upstream of the another thermally conductive fin region in the direction of coolant flow through the coolant-carrying compartment.

Various embodiments of the coolant filter (or coolant filter subassembly) are provided below. For instance, in one or more embodiments, the coolant filter is positioned within the thermally conductive structure of the liquid-cooled heat sink upstream of the region of reduced cross-sectional coolant flow area within the coolant-carrying compartment. In one embodiment, the cross-sectional coolant flow area of the coolant filter is at least twice as large as the cross-sectional coolant flow area of the region of reduced cross-sectional coolant flow area of the coolant-carrying compartment within the thermally conductive structure of the liquid-cooled heat sink, and the region of reduced cross-sectional coolant flow area includes one or more coolant flow openings or channels with a critical coolant flow dimension less than 0.5 mm.

In another implementation, the coolant filter is replaceable, notwithstanding that the liquid-cooled heat sink remains coupled to the at least one electronic component to be cooled. In another implementation, the coolant-carrying compartment may comprise a converging inlet plenum converging towards the region of reduced cross-sectional coolant flow area, and the coolant filter may be disposed within the converging inlet plenum. In another embodiment, the coolant filter encircles the region of reduced cross-sectional coolant flow area within the thermally conductive structure of the liquid-cooled heat sink. In this embodiment, coolant traverses through at least a portion of the reduced cross-sectional coolant flow area of the coolant-carrying compartment of the thermally conductive structure, and exhausts from the thermally conductive structure over the region of reduced cross-sectional coolant flow area.

In certain embodiments, the coolant filter is associated with the coolant loop to filter the coolant before ingressing via the coolant inlet into the coolant-carrying compartment of the thermally conductive structure of the liquid-cooled heat sink. For instance, the coolant filter may be disposed within a coolant filter subassembly which includes a first end and a second end, which couple in fluid communication with the coolant loop to facilitate flow of coolant within the coolant loop through the coolant filter. The first end and the second end of the coolant filter subassembly may comprise a first quick connect coupler and a second quick connect coupler, respectively. In another implementation, the coolant filter is disposed upstream of the liquid-cooled heat sink within a coolant loop connection subassembly, wherein the cross-sectional coolant flow area of the coolant filter is larger than a transverse cross-sectional coolant flow area of the coolant loop.

As a specific example, FIGS. 5A-5D depict one embodiment of a cooled electronic module, generally denoted 500, in accordance with one or more aspects of the present invention. Referring collectively to FIGS. 5A-5D, cooled electronic module 500 includes one or more electronic components 501 to be cooled and a liquid-cooled heat sink 510 coupled to the electronic component(s) 501 to facilitate transfer of heat from the component to, for instance, a liquid coolant passing through liquid-cooled heat sink 510. In one example, the liquid coolant may comprise a system coolant distributed such as described above in connection with FIGS. 2-4.

Liquid-cooled heat sink 510 includes a thermally conductive structure 502, such as a thermally conductive casing or housing, fabricated (for instance) of a metal, which includes a coolant-carrying compartment (e.g., chamber, channel, tube, passageway, etc.), through which coolant flows in a direction 505 through the compartment from a coolant inlet 511 to a coolant outlet 512 of the liquid-cooled heat sink 510. In this example, thermally conductive structure 502 includes a main heat transfer surface 504 coupled to and in thermal communication with the electronic component(s) 501 to facilitate heat transfer from the component(s) to the heat sink, and hence, to the coolant flowing through the heat sink. As one example, this main heat transfer surface may comprise the base surface of the liquid-cooled heat sink, configured as disclosed herein.

Figure 5A:
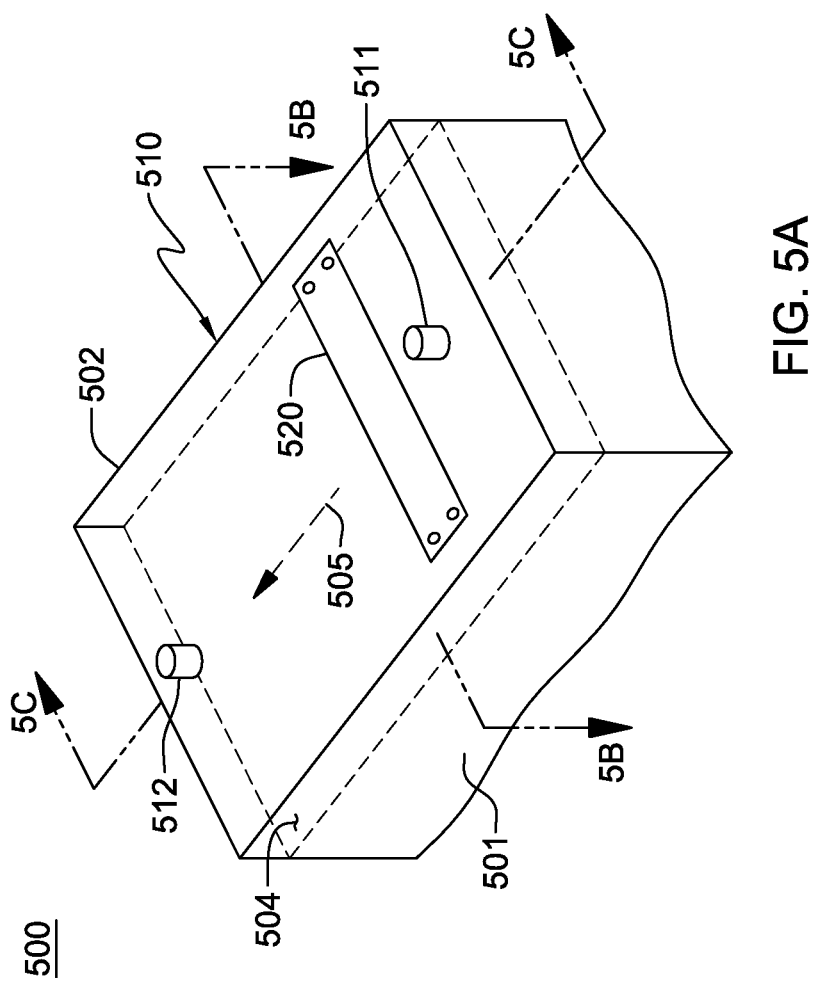
FIG. 5A depicts one embodiment of a cooled electronic module comprising at least one electronic component and a cooling apparatus which includes a liquid-cooled heat sink, in accordance with one or more aspects of the present invention.
Figure 5B:
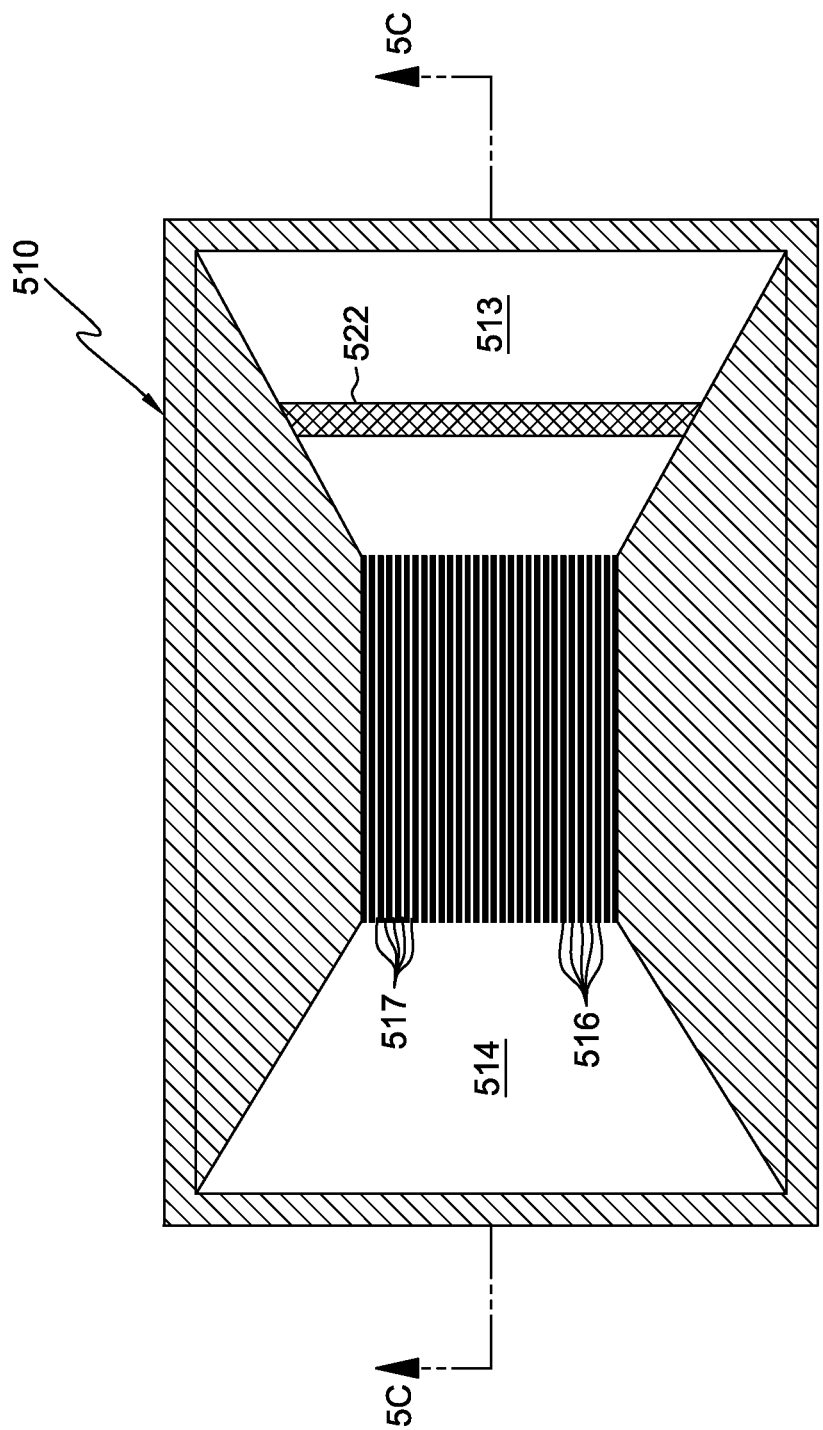
FIG. 5B depicts one embodiment of the liquid-cooled heat sink of FIG. 5A, taken along line 5B-5B thereof, in accordance with one or more aspects of the present invention.

As illustrated in the cross-sectional plan view of FIG. 5B, and cross-sectional elevational views of FIGS. 5C & 5D, liquid-cooled heat sink 510 includes within the coolant-carrying compartment, a coolant inlet manifold 513 and a coolant outlet manifold 514, disposed adjacent to coolant inlet 511 and coolant outlet 512, respectively. Coolant inlet manifold 513 is, by way of example, a converging inlet manifold, which facilitates ensuring a lower velocity of liquid flow across a coolant filter 522 disposed within the coolant inlet manifold 513, and thus results in a lower pressure drop. The coolant outlet manifold 514 may be diverging (as illustrated) to further facilitate coolant flow through the coolant-carrying compartment of the liquid-cooled heat sink.

Coolant inlet manifold 513 receives coolant from the coolant inlet 511, and coolant outlet manifold 514 exhausts coolant from the coolant-carrying compartment through the coolant outlet 512. Disposed between the coolant inlet and the coolant outlet manifolds 513, 514 are one or more coolant flow regions 515. The coolant flow region(s) 515 is, by way of example, at least one region of reduced cross-sectional coolant flow area through which coolant flows. For instance, a plurality of plate fins 516 may be arrayed in parallel with small coolant flow channels 517 formed between the plate fins 516.

Each coolant flow channel may comprise a transverse cross-sectional coolant flow area (or opening) with a critical coolant flow dimension of, for instance, less than 0.5 mm. For example, the critical dimension may be 0.3 mm or less. Note that various regions of reduced cross-sectional coolant flow area may be provided within the coolant-carrying compartment of liquid-cooled heat sink 510. For instance, multiple regions of reduced coolant flow area may be provided with differing cross-sectional coolant flow areas, as noted above. Further, note that parallel plate fins 516 are presented by way of example only. In one or more other embodiments, pin fins could be closely spaced such that one or more regions of reduced cross-sectional coolant flow area are defined as part of the coolant-carrying compartment using the pin fins.

With one or more coolant flow openings (or transverse cross-sectional areas) through one or more channels of the reduced cross-sectional coolant flow area having a critical coolant flow dimension less than 0.5 mm, particulate filtering from the coolant is desirable. In the embodiments of FIGS. 5A-5D, the coolant filter 522 is part of a coolant filter subassembly 520, and is replaceable while the liquid-cooled heat sink 510 remains physically coupled to the one or more electronic components 501 to be cooled.

As illustrated in FIGS. 5C & 5D, coolant filter subassembly 520 may be attached, for example, using threaded fasteners, to an upper surface of the thermally conductive structure 502, with the coolant filter 522 extending into the coolant inlet plenum 513. A fluid-tight seal may be accomplished using an O-ring 523, sized to reside in an appropriately formed channel 524 in the upper surface of liquid-cooled heat sink 510. One or more fasteners 525 may be employed to secure coolant filter subassembly 520 to the liquid-cooled heat sink 510, as well as to facilitate removal of coolant filter subassembly 520 from the liquid-cooled heat sink 510, for instance, to replace coolant filter 522. FIG. 5C illustrates coolant filter subassembly 520 in operational state, and FIG. 5D illustrates the coolant filter subassembly removed, for instance, to inspect or replace coolant filter 522.

In the above-described embodiment, liquid-cooled heat sink 510 of cooled electronic module 500 advantageously includes an integrated (or embedded) particulate filtration media inside the heat sink or cold plate. The particulate filtration media, also referred to herein as the coolant filter, comprises a filter or screen through or across which liquid coolant flows to remove particulate contamination from the liquid coolant. The coolant filter is sized and positioned so that the filter will capture the particulates, with no impact on the heat transfer surface area within the region of reduced cross-sectional coolant flow 515. Additionally, note that coolant filter 522 has a significantly larger transverse cross-sectional coolant flow area than the total transverse coolant flow areas (or openings) within the region of reduced cross-sectional coolant flow area. The larger filtration surface area exposed to the incoming liquid coolant will result in a longer life for the filter, with a lower pressure drop across the filter, even in the event of moderate particulate contamination within the liquid coolant.

The coolant filter or filtration media advantageously captures particles and prevents degradation of thermal performance in the region of reduced cross-sectional coolant flow area of the heat sink by preventing particulates from reaching and clogging the smaller coolant flow openings within the region of reduced cross-sectional coolant flow area. As one example, one or more critical dimensions of the coolant flow openings may be less than 0.5 mm within this region of reduced cross-sectional coolant flow area. Provision of a converging coolant inlet plenum advantageously allows for a lower surface velocity through the embedded coolant filter, and thus lowers the pressure drop across the filter.

The coolant filter may be fabricated of any desired filter or screen material, for instance, a porous material, such as a plastic, synthetic fiber, natural fiber, metal foam, etc., with pore sizes less than the critical dimension for coolant flow through the region(s) of reduced cross-sectional coolant flow area. In one specific example, the coolant filter may be a porous copper filter or screen brazed inside a copper heat sink, or in the example of FIGS. 5A-5D, brazed to the lid 521 of the coolant filter subassembly 520 for replacement with the subassembly. In the various embodiments disclosed herein, the coolant filter (or filtration media) has openings which are smaller than the coolant flow openings within the region of reduced cross-sectional coolant flow area of the coolant-carrying compartment within the liquid-cooled heat sink in order to trap any particulates within the filter.

FIGS. 6A-6B depict another embodiment of a cooling apparatus, generally denoted 600, comprising a liquid-cooled heat sink 610, in accordance with one or more aspects of the present invention. Referring collectively to FIGS. 6A & 6B, liquid-cooled heat sink 610 includes a thermally conductive structure 602, such as a thermally conductive casing or housing, which defines a coolant-carrying compartment (or chamber, passageway, etc.), through which coolant flows from a coolant inlet 611 to a coolant outlet 612. The coolant-carrying compartment includes one or more regions 615 of reduced cross-sectional coolant flow area, which may be configured such as described above in connection with the embodiment of FIGS. 5A-5D. In the current embodiment, coolant filter 622 is an embedded filtration media that encircles the region(s) 615 of reduced cross-sectional coolant flow area. For instance, coolant filter 622 may be disposed within a coolant inlet manifold 613 in fluid communication with coolant inlet 611, with the coolant outlet 612 being disposed over the region(s) 615 of reduced coolant flow area such that coolant flow 625 is initially through coolant filter 622, and then into and up from, region(s) 615 of reduced coolant flow area to coolant outlet 612, as illustrated in FIG. 6A. More particularly, after passing through the coolant filter, coolant flow 625 enters the region(s) 615 of reduced coolant flow area (e.g., a fin array such as described above) and travels inwards for a distance, towards the center of region 615. At the middle, the coolant enters, for instance, a coolant outlet plenum (not shown) that runs along the width of the fin array, which is in fluid communication with coolant outlet 612 to exhaust coolant from the liquid-cooled heat sink 610.

Advantageously, the configuration of FIGS. 6A & 6B provides an even larger surface area for coolant filter 622, and thus a longer life for the coolant filter. This design also provides a lower pressure drop through the coolant filter because of the enlarged size of the filter, compared with, for instance, the embodiments of FIGS. 5A-5D.

Figure 7A:
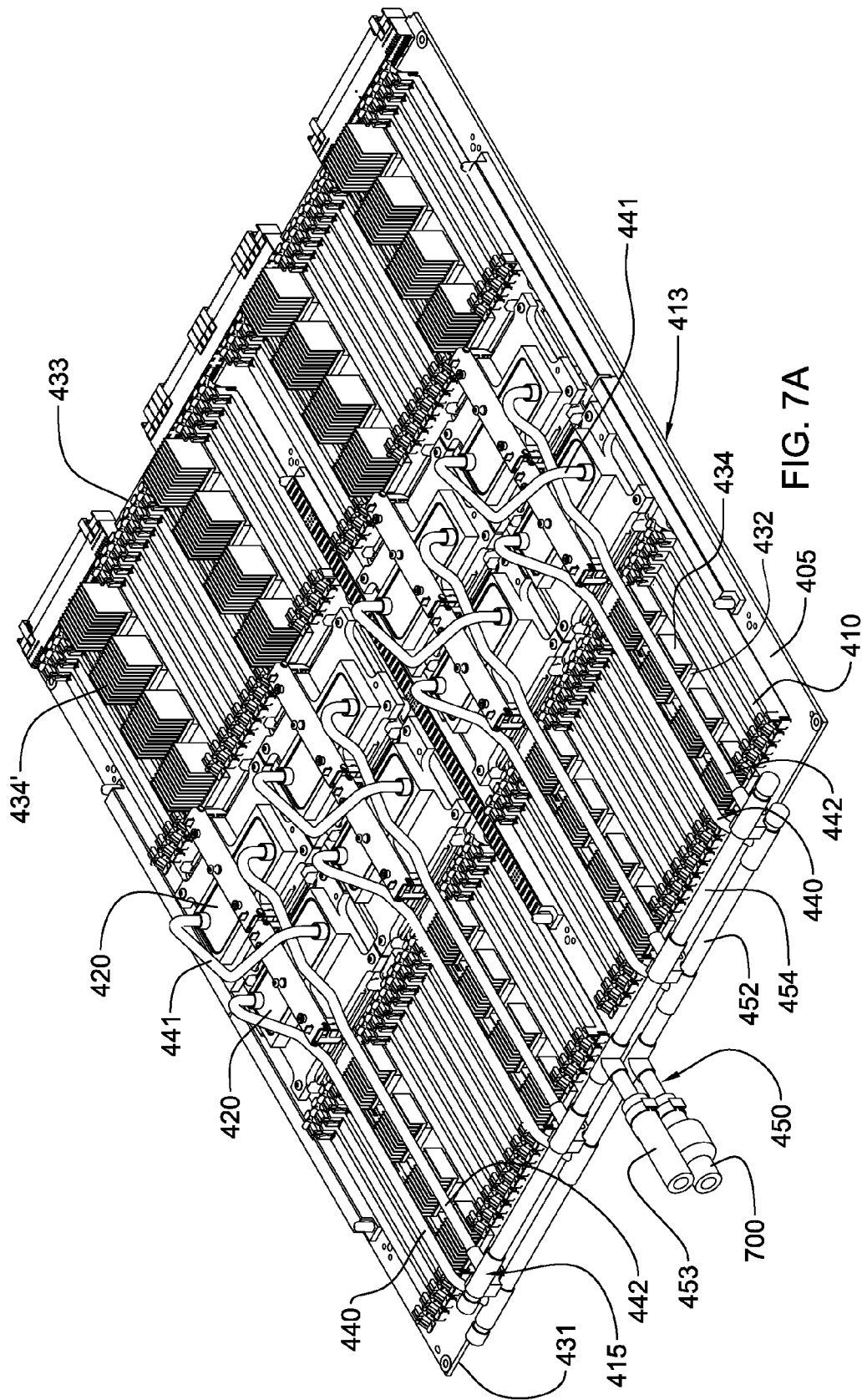
FIG. 7A depicts an alternate embodiment of the partially assembled electronic system layout of FIG. 4, wherein the cooling apparatus includes a coolant filter subassembly, in accordance with one or more aspects of the present invention.

FIG. 7A depicts an alternate embodiment of the partially-assembled electronic system layout of FIG. 4, wherein the coolant apparatus includes a coolant filter subassembly 700 positioned at the coolant inlet to coolant supply header 452 of header assembly 450. Note that this positioning is provided by way of example only, and in other embodiments, coolant filter subassembly 700 could be located closer to the respective liquid-cooled cold plates or heat sinks 420 of the coolant apparatus.

Figure 7B:
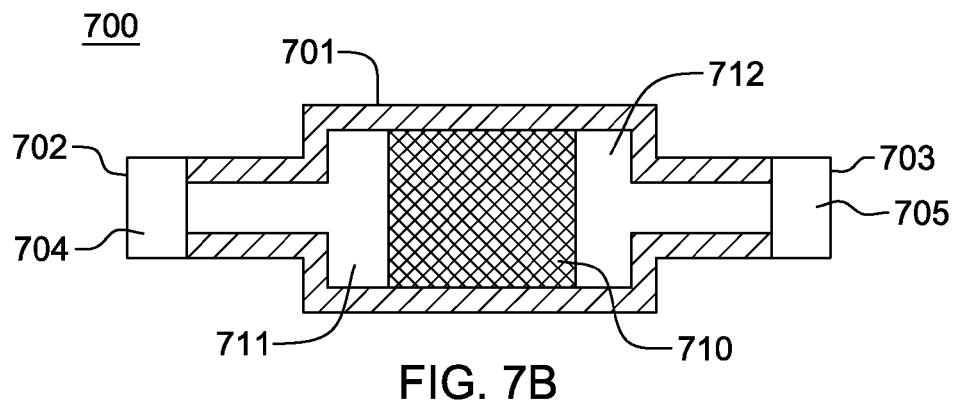
FIG. 7B is a cross-sectional elevational view of one embodiment of the coolant filter subassembly of FIG. 7A, in accordance with one or more aspects of the present invention.

FIG. 7B is a cross-sectional elevational view of one embodiment of coolant filter subassembly 700. As illustrated, coolant filter subassembly 700 includes a casing (or housing) 701 which has a larger cross-sectional coolant flow area in a central region thereof, within which a coolant filter 710 is disposed. The coolant filter subassembly 700 further includes a first end 702 and a second end 703, each of which may include a fluidic interconnectors 704, 705, respectively. In one embodiment, fluidic interconnector 704, 705 may be respective quick connect couplings to facilitate, for instance, coupling of the coolant filter subassembly to the header subassembly 450 in the example of FIG. 7A. In operation, coolant flowing through the coolant loop (not shown) flows through first end 702 to a coolant supply manifold 711, and from coolant supply plenum 711, through coolant filter 710, to a coolant exhaust manifold 712, from which coolant is exhausted via second end 703.

Figure 7C:
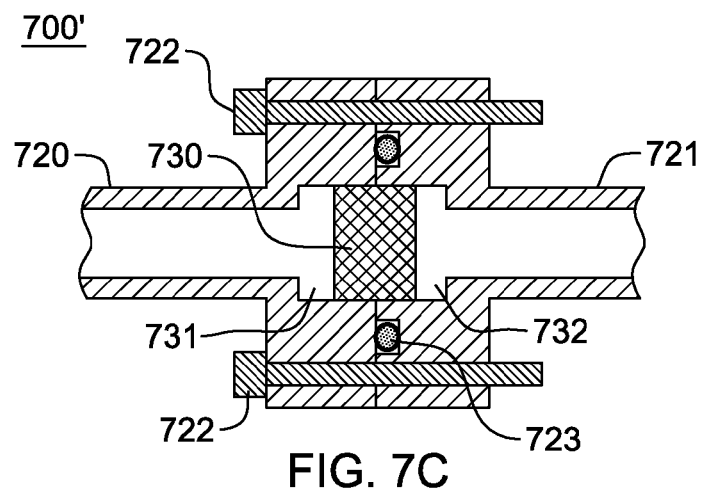
FIG. 7C depicts an alternate embodiment of a coolant filter subassembly (configured, in this example, as part of a coolant loop connection subassembly) for a liquid-cooling apparatus such as depicted in FIG. 7A, in accordance with one or more aspects of the present invention.
Figure 7D:
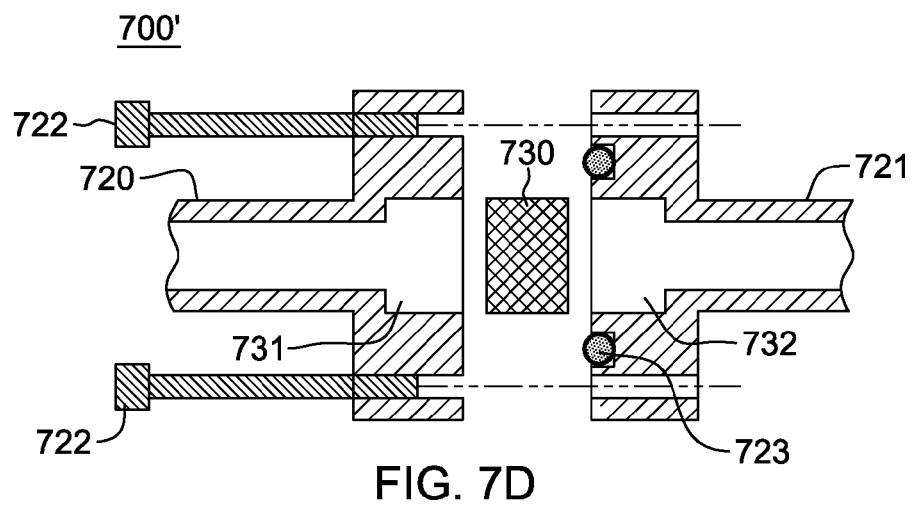
FIG. 7D depicts the coolant filter subassembly of FIG. 7C uncoupled to, for instance, facilitate replacement of a filter or filtration media cartridge, in accordance with one or more aspects of the present invention.

FIGS. 7C & 7D depict an alternate embodiment of a coolant filter subassembly, in accordance with one or more aspects of the present invention. In this embodiment, the coolant filter subassembly is configured as a coolant loop connection subassembly 700', which includes a first coolant loop conduit 720 and a second coolant loop conduit 721, configured with an enlarged, fluidic interconnect region sized to accommodate a coolant filter 730, as well as to provide a coolant inlet manifold 731 and a coolant outlet manifold 732 to facilitate flow of coolant through coolant inlet 730. As illustrated, the coolant flow area (or surface area) of coolant filter 730 is larger, in one embodiment, than the transverse cross-sectional coolant flow area of coolant through either the first coolant loop conduit 720 or second coolant loop conduit 721. An O-ring 723 and appropriate fasteners 722 may be provided to ensure a fluid-tight coupling between the first and second coolant loop conduits 720, 721.

Note that the configurations of FIGS. 7A & 7B and FIGS. 7C & 7D advantageously provide filtration to a liquid-cooled assembly outside of the liquid-cooled heat sinks, and thus, in these embodiments, one coolant filter may filter particulate from coolant for multiple heat sinks. Also, note that, in the embodiments of FIGS. 7A-7D, the coolant filter may be readily replaced by temporarily suspending coolant flow through the cooling assembly, and opening the appropriate interconnects to replace the coolant filter. In the embodiment of FIGS. 7A & 7B, the entire coolant filter subassembly may be field-replaceable, while in the embodiment of FIGS. 7C & 7D, only the coolant filter itself need be replaced.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention.

What is claimed is:

1. A cooling apparatus comprising:
   a liquid-cooled heat sink configured to cool at least one electronic component, the liquid-cooled heat sink comprising:
   a thermally conductive structure with a coolant-carrying compartment comprising, at least in part, a region of reduced cross-sectional coolant flow area through which coolant flows;
   a coolant inlet and a coolant outlet associated with the thermally conductive structure and in fluid communication with the coolant-carrying compartment of the thermally conductive structure to facilitate coolant flow therethrough;
   wherein the region of reduced cross-sectional coolant flow area of the coolant-carrying compartment provides an increased effective heat transfer coefficient between a main heat transfer surface of the thermally conductive structure and the coolant within the coolant-carrying compartment;
   a coolant loop coupled to the coolant inlet and the coolant outlet of the liquid-cooled heat sink to facilitate flow of coolant through the coolant-carrying compartment thereof;
   a coolant filter positioned to filter contaminants from the coolant passing through the liquid-cooled heat sink, the coolant filter having a larger cross-sectional coolant flow area than the region of reduced cross-sectional coolant flow area of the coolant-carrying compartment within the thermally conductive structure of the liquid-cooled heat sink; and wherein the coolant filter is associated with the coolant loop for filtering the coolant before ingressing via the coolant inlet into the coolant-carrying compartment of the thermally conductive structure of the liquid-cooled heat sink; and wherein the coolant filter is disposed upstream of the liquid-cooled heat sink within a coolant loop connection subassembly, wherein the cross-sectional coolant flow area of the coolant filter is larger than a cross-sectional coolant flow area of the coolant loop.

2. The cooling apparatus of claim 1, wherein the coolant filter is positioned within the thermally conductive structure of the liquid-cooled heat sink upstream of the region of reduced cross-sectional coolant flow area of the coolant-carrying compartment.

3. The cooling apparatus of claim 2, wherein the cross-sectional coolant flow area of the coolant filter is at least twice as large as the cross-sectional coolant flow area of the region of reduced cross-sectional coolant flow area of the coolant-carrying compartment within the thermally conductive structure of the liquid-cooled heat sink.

4. The cooling apparatus of claim 2, wherein the coolant filter is replaceable, with the liquid-cooled heat sink coupled to the at least one electronic component to be cooled.

5. The cooling apparatus of claim 2, wherein the coolant-carrying compartment comprises a converging inlet plenum converging towards the region of reduced cross-sectional coolant flow area, and wherein the coolant filter is disposed within the converging inlet plenum.

6. The cooling apparatus of claim 2, wherein the coolant filter encircles the region of reduced cross-sectional coolant flow area.

7. The cooling apparatus of claim 6, wherein the coolant traverses through at least a portion of the reduced cross-sectional coolant flow area of the coolant-carrying compartment of the thermally conductive structure and exhausts from the thermally conductive structure over the region of reduced cross-sectional coolant flow area.

8. The cooling apparatus of claim 1, wherein the coolant filter subassembly comprises a first end and a second end which couple in fluid communication with the coolant loop to facilitate flow of coolant within the coolant loop through the coolant filter, the first end and the second end comprising a first quick connect coupler and a second quick connect coupler, respectively.

9. A cooling apparatus comprising:
a liquid-cooled heat sink configured to cool at least one electronic component, the liquid-cooled heat sink comprising:
a thermally conductive structure with a coolant-carrying compartment comprising, at least in part, a region of reduced cross-sectional coolant flow area through which coolant flows;
a coolant inlet and a coolant outlet associated with the thermally conductive structure and in fluid communication with the coolant-carrying compartment of the thermally conductive structure to facilitate coolant flow therethrough;
wherein the region of reduced cross-sectional coolant flow, area of the coolant-carrying compartment provides an increased effective heat transfer coefficient between a main heat transfer surface of the thermally conductive structure and the coolant within the coolant-carrying compartment;

a coolant loop coupled to the coolant inlet and the coolant outlet of the liquid-cooled heat sink to facilitate flow of coolant through the coolant-carrying compartment thereof; and a coolant filter positioned to filter contaminants from the coolant passing through the liquid-cooled heat sink, the coolant filter having a larger cross-sectional coolant flow area than the region of reduced cross-sectional coolant flow area of the coolant-carrying compartment within the thermally conductive structure of the liquid-cooled heat sink, wherein the region of reduced cross-sectional coolant flow area comprises a coolant flow opening with a critical coolant flow dimension less than 0.5 mm.

10. A cooled electronic module comprising;
at least one electronic component to be cooled; and
a cooling apparatus to facilitate cooling of the at least one electronic component, the cooling apparatus comprising:
a liquid-cooled heat sink coupled to the at least one electronic component to be cooled, the liquid-cooled heat sink comprising:
a thermally conductive structure with a coolant-carrying compartment comprising, at least in part, a region of reduced cross-sectional coolant flow area through which coolant flows;
a coolant inlet and a coolant outlet associated with the thermally conductive structure and in fluid communication with the coolant-carrying compartment of the thermally conductive structure to facilitate coolant flow therethrough;
wherein the region of reduced cross-sectional coolant flow area of the coolant-carrying compartment provides an increased effective heat transfer coefficient between a main heat transfer surface of the thermally conductive structure and the coolant within the coolant-carrying compartment;
a coolant loop coupled to the coolant inlet and the coolant outlet of the liquid-cooled heat sink to facilitate flow of coolant through the coolant-carrying compartment thereof; and
a coolant filter positioned to filter contaminants from the coolant passing through the liquid-cooled heat sink, the coolant filter having a larger cross-sectional coolant flow area than the region of reduced cross-sectional coolant flow area of the coolant-carrying compartment within the thermally conductive structure of the liquid-cooled heat sink.

11. The cooled electronic module of claim 10, wherein the coolant filter is positioned within the thermally conductive structure of the liquid-cooled heat sink upstream of the region of reduced cross-sectional coolant flow area of the coolant-carrying compartment.

12. The cooled electronic module of claim 11, wherein the cross-sectional coolant flow area of the coolant filter is at least twice as large as the cross-sectional coolant flow area of the region of reduced cross-sectional coolant flow area of the coolant-carrying compartment within the thermally conductive structure of the liquid-cooled heat sink.

13. The cooled electronic module of claim 11, wherein the coolant filter is replaceable, with the liquid-cooled heat sink coupled to the at least one electronic component to be cooled.

14. The cooled electronic module of claim 11, wherein the coolant-carrying compartment comprises a converging inlet plenum converging towards the region of reduced cross-sectional coolant flow area, and wherein the coolant filter is disposed within the converging inlet plenum.

15. The cooled electronic module of claim 11, wherein the coolant filter encircles the region of reduced cross-sectional coolant flow area.

16. The cooled electronic module of claim 15, wherein the coolant traverses through at least a portion of the reduced cross-sectional coolant flow area of the coolant-carrying compartment of the thermally conductive structure and exhausts from the thermally conductive structure over the region of reduced cross-sectional coolant flow area.

17. The cooled electronic module of claim 10, wherein the coolant filter is disposed within a coolant filter subassembly, the coolant filter subassembly comprising a first end and a second end which couple in fluid communication with the coolant loop to facilitate flow of coolant within the coolant loop through the coolant filter, the first end and the second end comprising a first quick connect coupler and a second quick connect coupler, respectively.

* * * * *